(12) United States Patent
Satoh

(10) Patent No.: US 11,282,566 B2
(45) Date of Patent: Mar. 22, 2022

(54) APPARATUSES AND METHODS FOR DELAY CONTROL

(71) Applicant: Micron Technology, Inc., Boise, ID (US)

(72) Inventor: Yasuo Satoh, Ibaraki (JP)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 16/743,616

(22) Filed: Jan. 15, 2020

(65) Prior Publication Data

US 2021/0217457 A1    Jul. 15, 2021

(51) Int. Cl.
| | |
|---|---|
| *G11C 11/4076* | (2006.01) |
| *H03L 7/081* | (2006.01) |
| *H03K 5/14* | (2014.01) |
| *H03K 5/131* | (2014.01) |
| *H03K 5/00* | (2006.01) |

(52) U.S. Cl.
CPC .......... *G11C 11/4076* (2013.01); *H03K 5/131* (2013.01); *H03K 5/14* (2013.01); *H03L 7/0814* (2013.01); *H03L 7/0818* (2013.01); *H03K 2005/00019* (2013.01); *H03K 2005/00241* (2013.01)

(58) Field of Classification Search
None
See application file for complete search history.

(56) References Cited

U.S. PATENT DOCUMENTS

| | | | |
|---|---|---|---|
| 2016/0277015 A1* | 9/2016 | Ma | H03K 5/1565 |
| 2019/0288674 A1* | 9/2019 | Satoh | G11C 19/28 |

\* cited by examiner

*Primary Examiner* — Cassandra F Cox
(74) *Attorney, Agent, or Firm* — Dorsey & Whitney LLP

(57) ABSTRACT

Apparatuses and methods for adjusting a phase mixer circuit are disclosed. An example method includes providing data values stored by a plurality of first registers and a plurality of second registers. The method includes: during a first mode of operation, receiving the data values by groups of first registers of the plurality of the first registers and holding the data values by the plurality of second registers; during a second mode of operation, inverting a data value by one first register of the plurality of first registers at a time and holding the data values by the plurality of second registers; and during a third mode of operation, either inverting the data value by one first register of the plurality of first registers while holding the data values by the plurality of second registers or inverting a data value by one second register of the plurality of second registers while holding the data values by the plurality of first registers.

13 Claims, 11 Drawing Sheets

APPARATUSES AND METHODS FOR DELAY CONTROL

BACKGROUND

High data reliability, high speed of memory access, lower power consumption and reduced chip size are features that are demanded from semiconductor memory. To achieve higher memory access speed, operational timing in the semiconductor memory is adjusted using a clock signal as a reference signal.

When an external clock signal enters into a circuit, the clock phase of internal clock signals based on the external clock signal may be delayed because of the inherent delay of the components of the circuit. At high operating speeds, distortions in a clock signal duty cycle may adversely affect the functioning of the circuit. To accommodate these delays and distorting effects, a clock path may include a delay circuit. The clock phase may be adjusted to match the phase of the external clock using a delay circuit such as a delay locked loop ("DLL"). Traditional DLL's may include a single phase mixer that receives two input signals (e.g., clock signals) offset by some phase difference and provide an output signal having a phase that is a mix of the phases of the two input signals. In order to adjust the delay of the output signal, the phase mixer may receive one or more control signals for weighting the phases of the input signals so that the output signal is a weighted combination of the phases of the input signals. The weighting may be adjusted to provide an output signal having a desired phase. However, conventional phase mixers are likely to take time to compare external and internal clock phases and determine a delay, thus providing a delay adjustment with finer resolutions may sacrifice a tracking speed.

BRIEF DESCRIPTION OF THE DRAWINGS

FIG. 7 is a control table showing a relationship between control signals and weights of clock signals to be mixed in accordance with an embodiment of the present disclosure.

FIG. 8 is a control table showing a relationship between control signals and weights of clock signals to be mixed in accordance with an embodiment of the present disclosure.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
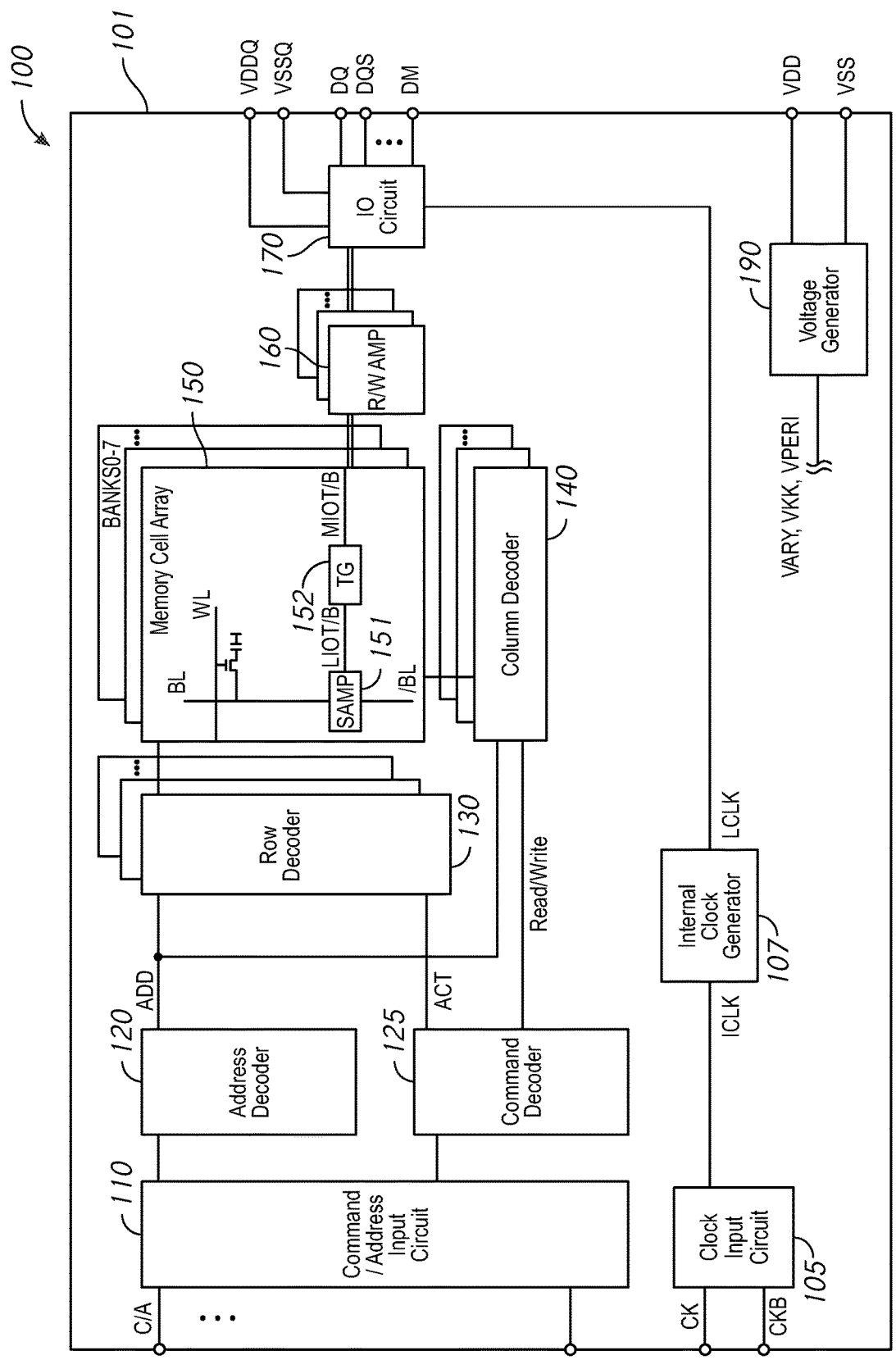
FIG. 1 is a schematic block diagram of a chip of a semiconductor memory device, in accordance with an embodiment of the present disclosure.

FIG. 1 is a schematic block diagram of a chip 101 of a semiconductor memory device 100, in accordance with an embodiment of the present disclosure. For example, the semiconductor memory device 100 is an apparatus that may include a plurality of chips, including the chip 101. For example, the chip 101 may include a clock input circuit 105, an internal clock generator 107, a command and address input circuit 110, an address decoder 120, a command decoder 125, a plurality of row decoders 130, a memory cell array 150 including sense amplifiers 151 and transfer gates 152, a plurality of column decoders 140, a plurality of read/write amplifiers 160, an input/output (IO) circuit 170, and a voltage generator circuit 190. The semiconductor memory device 100 may include a plurality of external terminals including address and command terminals coupled to command/address buses, clock terminals CK and /CK, data terminals DQ, a data strobe terminal DQS, and a data mask terminal DM and power supply terminals VDD, VSS, VDDQ, and VSSQ.

The memory cell array 150 includes a plurality of banks (e.g., Banks0-7), each bank including a plurality of word lines WL, a plurality of bit lines BL, and a plurality of memory cells MC arranged at intersections of the plurality of word lines WL and the plurality of bit lines BL. The selection of the word line WL for each bank is performed by a corresponding row decoder 130 and the selection of the bit line BL is performed by a corresponding column decoder 140. The plurality of sense amplifiers SAMP 151 are located for their corresponding bit lines BL and coupled to at least one respective local I/O line (e.g., LIOT/B) further coupled to a respective one of at least two main I/O line pairs (e.g., MIOT/B), via transfer gates TG 152, which function as switches.

The command and address input circuit 110 may receive an address signal and a bank address signal from outside at the command/address terminals via the command/address bus (C/A) and transmit the address signal and the bank address signal to the address decoder 120. The address decoder 120 may decode the address signal received from the command and address input circuit 110 and provide address signals ADD. The address signals ADD may include a row address signal to the row decoder 130, and a column address signal to the column decoder 140. The address decoder 120 may also receive the bank address signal and provide the bank address signal to the row decoder 130 and the column decoder 140.

The command and address input circuit 110 may receive a command signal from outside, such as, for example, at the command/address terminals via the command/address buses and provide the command signal to the command decoder 125. The command decoder 125 may decode the command signal and provide generate various internal command signals. For example, the internal command signals may include a row command signal to select a word line, a column command signal, such as a read command or a write command, to select a bit line.

Accordingly, when an activation command is issued and a row address is timely supplied with the activation command, and a read command is issued and a column address is timely supplied with the read command, read data is read from a memory cell in the memory cell array 150 designated by the row address and the column address. The read/write amplifiers 160 may receive the read data and provide the read data to the IO circuit 170. The IO circuit 170 may provide the read data to outside via the data terminals DQ together with a data strobe signal at the data strobe terminal DQS and a data mask signal at the data mask terminal DM. Similarly, when the activation command is issued and a row address is timely supplied with the activation command, and a write command is issued and a column address is timely supplied with the write command, the IO circuit 170 may receive write data at the data terminals DQ, DQS, DM, together with a data strobe signal at DQS and a data mask signal at DM and provide the write data via the read/write amplifiers 160 to the memory cell array 150. Thus, the write data may be written in the memory cell designated by the row address and the column address.

Turning to the explanation of the external terminals included in the semiconductor device 100, the clock terminals CK and CKB may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK. For example, a DLL circuit may be used as the internal clock generator 107. The internal clock generator 107 may provide the phase controlled internal clock signal LCLK to the IO circuit 170. The IO circuit 170 may use the phase controlled internal clock signal LCLK as a timing signal for determining an output timing of read data.

The power supply terminals may receive power supply voltages VDD and VSS. These power supply voltages VDD and VSS may be supplied to a voltage generator circuit 190. The voltage generator circuit 190 may generate various internal voltages, VKK, VARY, VPERI, and the like based on the power supply voltages VDD and VSS. The internal voltage VKK may be used in the row decoder 130, the internal voltage VARY may be used in the sense amplifiers 151 included in the memory cell array 150, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
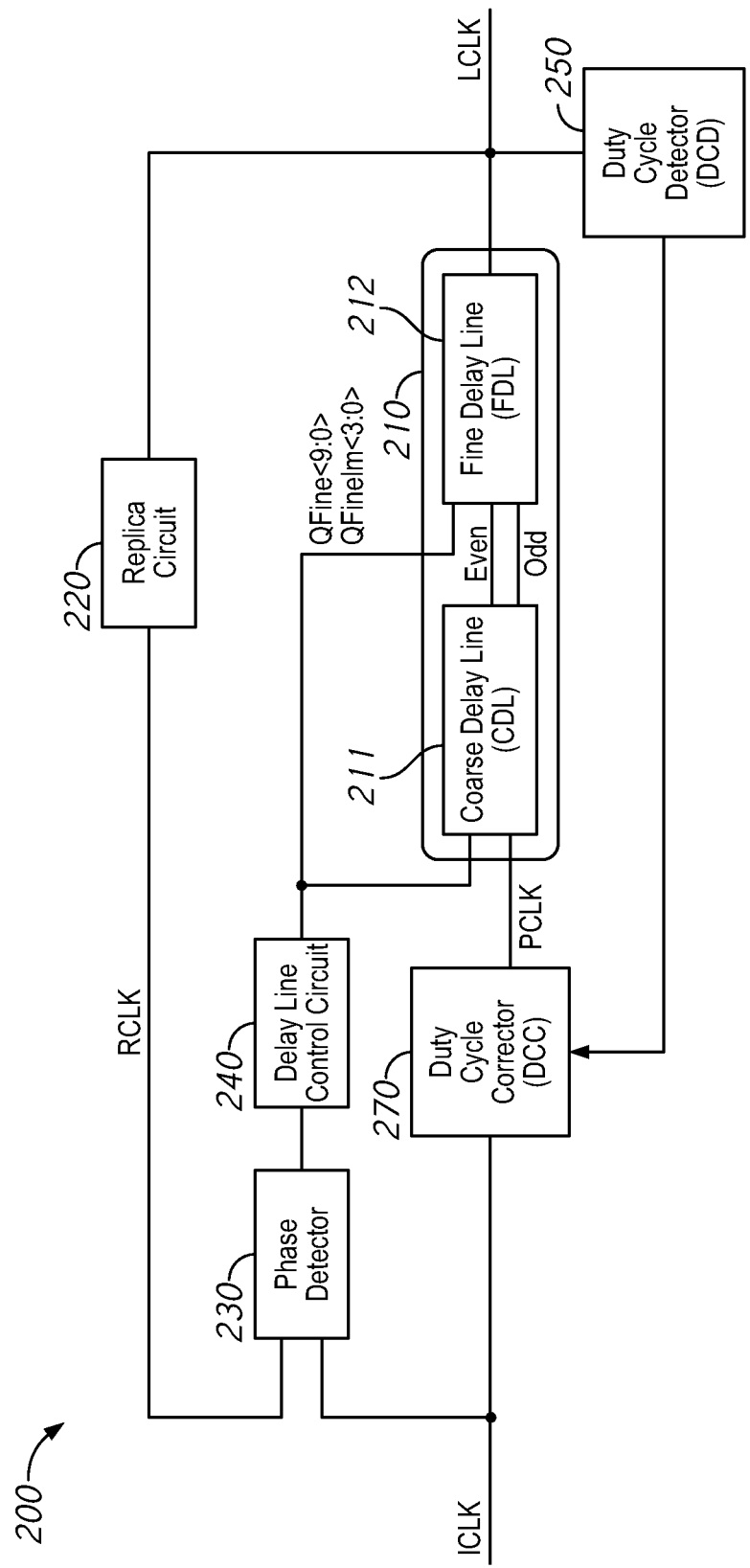
FIG. 2 is a block diagram of a DLL circuit in a semiconductor device according to an embodiment of the present disclosure.

FIG. 2 is a block diagram of a DLL circuit 200, in accordance with an embodiment of the present disclosure. The DLL circuit 200 may be the DLL circuit used as the internal clock generator 107. The DLL circuit 200 may include a delay line 210 that may generate an internal clock signal LCLK by delaying an internal clock signal PCLK. Here, the internal clock signal PCLK is an output signal of a duty cycle corrector (DCC) 270. The DCC 270 may receive an internal clock signal ICLK from the clock input circuit 105 upon receipts of external clock signals CK and CKB. The delay line 210 includes a coarse delay line (CDL) 211 having a low resolution with a coarse (e.g., large) step size of delay adjustment and a fine delay line (FDL) 212 having a high resolution with a fine (e.g., small) step size of delay adjustment, in a series connection. An output signal of the delay line 210 is provided as the internal clock LCLK. The internal clock LCLK may be provided, for example, to the IO circuit 170. The internal clock signal LCLK can be used as a reference signal for controlling timings of providing read data DQ and a data strobe signal DQS in FIG. 1.

The output signal of the delay line 210 may be also supplied to a replica circuit 220. The replica circuit 220 may represent a delay equivalent to a sum of delays on a clock path, including but not limited to, a delay of the IO circuit 170 and a delay of the clock input circuit 105. An output signal of the replica circuit 220 may be provided as a replica clock signal RCLK to a phase detector 230. The internal clock signal ICLK from the clock input circuit 105 may also be provided to the phase detector 230. In a semiconductor device with high speed memory access, the read data to be provided on the data terminals DQ and the data strobe signal at the data strobe terminal DQS need to be in synchronization with the external clock signals CK and CKB. The phase detector 230 may detect a phase shift between the replica clock signal RCLK and the internal clock signal ICLK reflecting the external clock signals CK and CKB, and provide a phase shift signal to a delay line control circuit 240. Responsive to the phase shift signal, the delay line control circuit 240 may provide control signals, including a fine shift right direction signal FSRD and its complementary signal FSRDF to control a delay of the delay line 210, accompanied by shift clock signals FSclk and FSclkF. When a phase of the replica clock signal RCLK is lagging a phase of the internal clock signal ICLK, the delay by the delay line 210 may be decreased. On the other hand, if the phase of the replica clock signal RCLK is leading of the phase of the internal clock signal ICLK, the delay in the delay line 210 may be increased. The delay of the delay line 210 such as the CDL 211 and the FDL 212 may be controlled to lock the phase of the replica clock signal RCLK in synchronization with the phase of the internal clock signal ICLK. For example, the CDL 211 may include a plurality of delay units coupled in series to provide even/odd input clock signals to the FDL 212. Here, the odd clock signal may be provided from a selected odd numbered one of the plurality of delay units and the even clock signal may be provided from a selected even numbered one of the plurality of delay units. The odd and even numbers are adjacent numbers. The even/odd input clock signals may have a phase difference relative to one another. The FDL 212 may further receive the sets of fine control signals FSRD and FSRDF and the clock signals FSclk and FSclkF responsive to the phase shift. The FDL 212 may provide the locked clock signal as the internal clock signal LCLK, responsive to the even/odd input clock signals and the fine control signals. Thus, the read data and the data strobe signal DQS may be in synchronization with the external clock signals CK and CKB.

Figure 3:
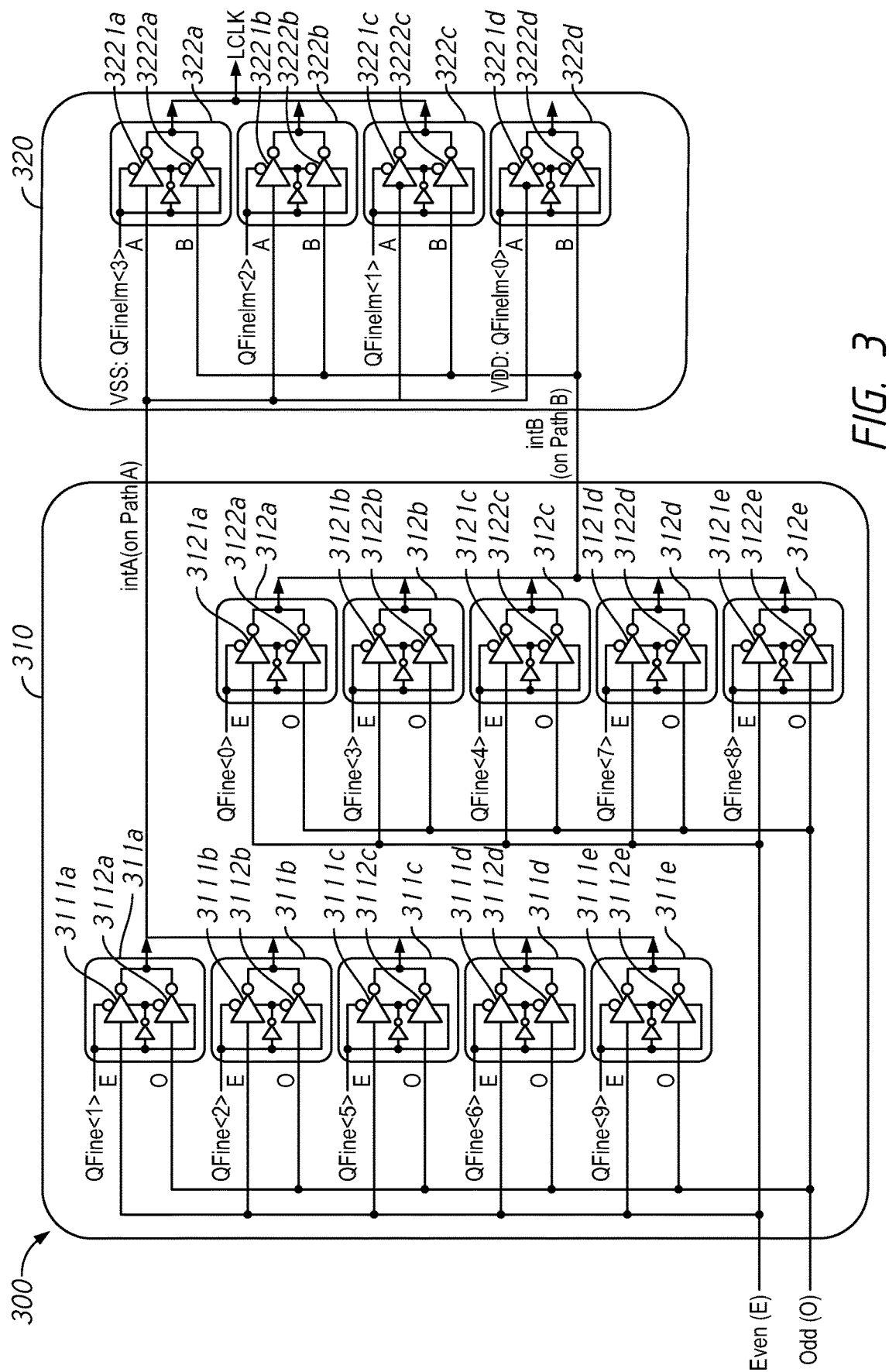
FIG. 3 is a schematic diagram of a phase mixer in the DLL circuit in accordance with an embodiment of the present disclosure.

FIG. 3 is a circuit diagram of a phase mixer 300 in the DLL circuit 200 in accordance with an embodiment of the present disclosure. For example, the phase mixer 300 may be an apparatus included in the delay line control circuit 240. The phase mixer 300 may receive a plurality of input clock signals (e.g., an even input clock signal ("E") and an odd input clock signal ("O")), and provide an internal clock signal ("LCLK") based on two sets of fine control signals QFine<9:0> and QFineIm<3:0>. Note a structure of a phase mixer in the FDL 212 of FIG. 2 may not be limited to this phase mixer 300. Instead, any logic circuit which may provide an internal clock signal LCLK responsive to the set of fine control signals QFine<9:0> and the set of fine control signals QFineIm<2:1> may properly serve as the phase mixer in the FDL 212. The sets of fine control signal QFine<9:0> and QFineIm<3:0> may be used for weighting the plurality of input clock signals E and O during phase mixing in providing the internal clock signal LCLK having a phase relative to the phases of the input clock signals. For example, the sets of fine control signal QFine<9:0> and QFineIm<3:0> may indicate that the internal clock signal LCLK may have the same phase as E, O, or a phase in between the two depending on the values represented by bits in the plurality of input clock signals E and O. The plurality of input clock signals E and O are input clock signals which may have the same cycle and a phase shift between them. The CDL 211 may provide the plurality of input clock signals E and O with a predetermined phase delay between them. For example, the even input clock signal E may be a clock signal provided from the CDL 211 to the FDL 212 and the odd input clock signal O may be a clock signal delayed by the predetermined phase delay by the CDL 211. Alternatively, the odd input clock signal O may lead the even input clock signal E by the predetermined phase delay.

The phase mixer 300 may include a plurality of internal phase mixer stages 310 and 320 for interpolating phases between the input clock signals E and O. In one embodiment, the phase mixer 300 may be configured to compensate for duty cycle distortion. Generally, each stage (e.g., 310, 320) of the phase mixer 300 may interpolate, or mix, the phases of the input clock signals in order to generate the output signal having a phase based on the phases of the input signals. The first stage 310 of the phase mixer 300 may receive the plurality of input clock signals E and O from the CDL 211 and the set of fine control signals QFine<9:0> from the phase detector 230, and may further apply a weight to the received input clock signals E and O based on the set of fine control signals QFine<9:0>. For example, the set of fine control signals QFine<9:0> may represent a phase mixing code as a 10 bit number as shown later in details referring to FIGS. 7A, 8 and 9. After applying the weight responsive to the set of fine control signals QFine<9:0>, the first stage 310 of the phase mixer 300 may provide intermediate clock signals intA and intB. The second stage 320 of the phase mixer 300 may receive the intermediate clock signals intA and intB from the first stage 310 and the set of fine control signals QFineIm<3:0> from the phase detector 230, and may further apply a weight to the received intermediate clock signals intA and intB based on the set of fine control signals QFineIm<3:0>. For example, the set of fine control signals QFineIm<3:0> may represent another phase mixing code as a 4 bit number as shown later in details referring to FIGS. 7A, 8 and 9. After applying the weight responsive to the set of fine control signals QFineIm<3:0>, the second stage 320 of the phase mixer 300 may provide the internal clock signal LCLK.

For example, the first stage 310 of the phase mixer 300 may include a set of sub mixers 311a to 311e. Each sub mixer of the set of sub mixers 311a to 311e may include a plurality of inverters. The even input clock signal E or the input clock signal O may be selected, responsive to each control signal of the QFine<1, 2, 5, 6, 9> that is a first phase mixing code, a portion of the 10 bit phase mixing code. For example, the even input clock signal E may be selected if the control signal represents "0" and the input clock signal O may be selected if the control signal represents "1." For example, the sub mixer 311a may include a plurality of inverters 3111a and 3112a, the sub mixer 311b may include a plurality of inverters 3111b and 3112b, the sub mixer 311c may include a plurality of inverters 3111c and 3112c, the sub mixer 311d may include a plurality of inverters 3111d and 3112d, and the sub mixer 311e may include a plurality of inverters 3111e and 3112e. Output nodes of these plurality of inverters 3111a to 3111e and 3112a to 3112e may be coupled together to Path A in order to provide the intermediate clock signal intA on Path A.

In some embodiments, the plurality of inverters may be tri-state (High-Z) inverters. Each sub mixer of the plurality of sub mixers 311a to 311e may include one inverter 3111 (for example, the inverter 3111a in the sub mixer 311a) for each bit included in a portion of fine control signals QFine<1, 2, 5, 6, 9> of the set of fine control signals QFine<9:0>. The inverters 3111a to 3111e of the sub mixers 311a to 311e may receive the even input clock signal E as inputs. The inverters 3111a to 3111e of the sub mixers 311a to 311e may further receive respective bits of the portion of fine control signals QFine<1, 2, 5, 6, 9> as control inputs. Based on the value of each respective bit of the portion of fine control signals QFine<1, 2, 5, 6, 9>, each of the inverters 3111a to 3111e may provide the value of the even input clock signal E or not provide the value of the even input clock signal E as a result of a high impedance state caused by the corresponding bit of the set of fine control signals QFine<1, 2, 5, 6, 9>. Application of the high impedance signal to any of the inverters 3111a to 3111e may effectively prevent the inverter that received the high impedance signal from providing an output signal on Path A. Accordingly, if more inverters of the plurality of 3111a to 3111e are activated by the set of fine control signals QFine<1, 2, 5, 6, 9>, then more of the input clock signal E may be transmitted to the intermediate clock signal intA. Similarly, each sub mixer of the plurality of sub mixers 311a to 311e may further include another tri-state inverter 3112 (for example, the inverter 3112a in the sub mixer 311a) for each bit included in the set of fine control signals QFine<1, 2, 5, 6, 9>. The inverters 3112a to 3112e of the sub mixers 311a to 311e may receive the odd input clock signal O as inputs. The inverters 3112a to 3112e of the sub mixers 311a to 311e may further receive inverted bits of respective bits of the set of fine control signals QFine<1, 2, 5, 6, 9> as control inputs. By activating more of either the inverters 3111a to 3111e or the inverters 3112a to 3112e, the intermediate clock signal intA on Path A may be weighted in favor of the phase of either the input clock signal E or the input clock signal O. In various embodiments, the inverters 3111a to 3111e and the inverters 3112a to 3112e may be similar or identical components with the only difference being the inputs provided to the components.

Similarly, for example, the first stage 310 of the phase mixer 300 may also include a set of sub mixers 312a to 312e. The even input clock signal E or the odd input clock signal O may be selected, responsive to each control signal of the QFine<0, 3, 4, 7, 8> that is a second phase mixing code, the other portion of the 10 bit phase mixing code. Each sub mixer of the set of sub mixers 312a to 312e may include inverters 3121 and 3122 for each bit included in the fine control signals QFine<0, 3, 4, 7, 8>, different from the portion of fine control signals QFine<1, 2, 5, 6, 9>, of the set of fine control signals QFine<9:0>. For example, the sub mixer 312a may include a plurality of inverters 3121a and 3122a, the sub mixer 312b may include a plurality of inverters 3121b and 3122b, the sub mixer 312c may include a plurality of inverters 3121c and 3122c, the sub mixer 312d may include a plurality of inverters 3121d and 3122d, and the sub mixer 312e may include a plurality of inverters 3121e and 3122e. Output nodes of these plurality of inverters 3121a, 3122a, 3121b, 3122b, 3121c, 3122c, 3121d, 3122d, 3121e and 3122e may be coupled together to Path B in order to provide the intermediate clock signal intB on Path B. The inverters 3121a to 3121e and 3122a to 3122e may be substantially similar to or identical to the inverters 3111a to 3111e and 3112a to 3112e. The inverters 3121a to 3121e may receive the even input clock signal E as inputs and the inverters 3122a to 3122e may receive the odd input clock signal O as inputs. The inverters 3121a to 3121e and 3122a to 3122e may be controlled by respective bits of the portion of fine control signals QFine<0, 3, 4, 7, 8> of the set of fine control signals QFine<9:0>, in the same manner as the inverters 3111a to 3111e and 3112a to 3112e. The output nodes of the inverters 3121a to 3121e and 3122a to 3122e may be coupled together to provide the intermediate clock signal intB signal on Path B having a phase between that of the even input clock signal E or the odd input clock signal O.

The second stage 320 of the phase mixer 300 may apply a weight to interpolate the phases of the intermediate clock signals intA and intB responsive to the set of fine control signals QFineIm<3:0>, the 4 bit phase mixing code, and provide the internal clock signal LCLK. The first stage 310 of the phase mixer 300 may also include a set of sub mixers 322a, 322b, 322c and 322d. Each sub mixer of the set of sub mixers 322a, 322b, 322c and 322d may include inverters 3221 and 3222 for each bit included in the set of fine control signals QFineIm<3:0>. The inverters 3221 and 3222 may be T tri-state (High-Z) inverters. The inverters 3221a, 3221b, 3221c and 3221d may receive the intermediate clock signal intA as a data input and respective bits of fine control signals QFineIm<3-0> where QFineIm<3> and QFineIm<0> are power supply signals (e.g., VSS and VDD). The inverters 3222a, 3222b, 3222c and 3222d may receive the intermediate clock signal intB as a data input and the respective bits of fine control signals QFineIm<3-0> that may. Output nodes of the inverters 3221a to 3221d and 3222a to 3222d are coupled together in order to provide the internal clock signal LCLK. One of the inverters 3221a and 3222a may be turned on and the other may be turned off responsive to the fine control signal QFineIm<3> that is the power supply signal VSS, and one of the inverters 3221b and 3222b may be turned on and the other may be turned off responsive to the fine control signal QFineIm<2>. One of the inverters 3221c and 3222c may be turned on and the other may be turned off responsive to the fine control signal QFineIm<1>. The inverter 3221d may receive QFineIm<0> that is the power supply signal VDD.

Figure 4A:
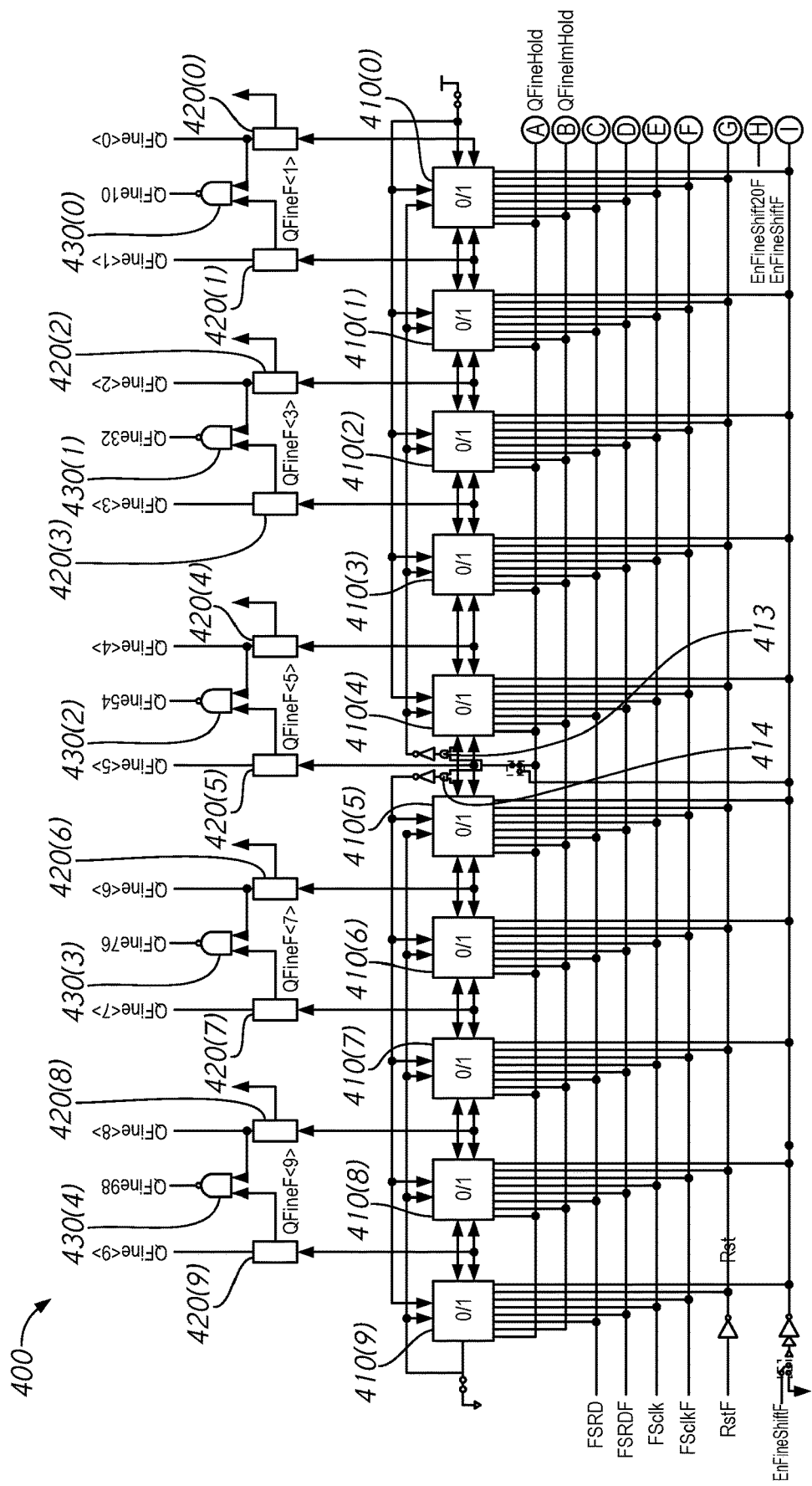
FIG. 4A is a circuit diagram of a portion of a shift register circuit in the DLL circuit in accordance with an embodiment of the present disclosure.

FIG. 4A is a circuit diagram of a portion of a shift register circuit 400 in the DLL circuit 200 in accordance with an embodiment of the present disclosure. For example, the shift register circuit 400 may be included in the FDL 212 of FIG. 2. Note a structure of a shift register circuit in the FDL 212 of FIG. 2 may not be limited to this shift register circuit 400. Instead, any logic circuit which may provide the set of fine control signals QFine<9:0> and the set of fine control signals QFineIm<2:1> may properly serve as the shift register circuit. The shift register circuit 400 may include shift registers 410(0)-410(9). FIG. 4C is a block diagram of a shift register 410 in the shift register circuit 400 in accordance with an embodiment of the present disclosure. In FIG. 4C, node assignments of the shift register 410 are shown. The shift registers 410(0)-410(9) may be coupled in series, and receive various control and clock signals. After an initialization, the shift registers 410(9)-410(5) may be preset to "0" and the shift registers 410(4)-410(0) may be preset to "1." The shift registers 410(0)-410(9) may receive control signals, such as the fine shift right direction signal FSRD and its complementary signal FSRDF that together control a shift direction for the shift registers 410(0)-410(9). The FSRD and FSRDF signals may control from which node of the shift register data is received. For example, the FSRD signal in an active state (e.g., logic high level) and the FSRDF signal in an inactive state (e.g., logic low level) may control the shift register 410 to receive data provided to input nodes QR or mQR of the shift register 410 and provide the data value to the output nodes Q (e.g., left Q node and right Q node) responsive to the shift clock signals FSclk and FSclkF. The FSRD signal in the inactive state (e.g., low logic level) and the FSRDF signal in the active state (e.g., logic high level) may control the shift register 410 to receive data provided to input nodes QL or mQL nodes of the shift register 410 and provide the data to the left Q node and the right Q node responsive to the FSclk and FSclkF clock signals. The FSclk and FSclkF clock signals are complementary. The shift registers 410(0)-410(9) may further receive control signals indicative of timings to hold the status of registers (e.g., disable bit shifting and keep storing the same data). For example, the control signals may include a fine hold signal QFineHold that controls a timing for the shift registers 410(0)-410(9) and a fine intermediate hold signal QFineImHold that is a complementary signal of the fine hold signal.

Figure 7:
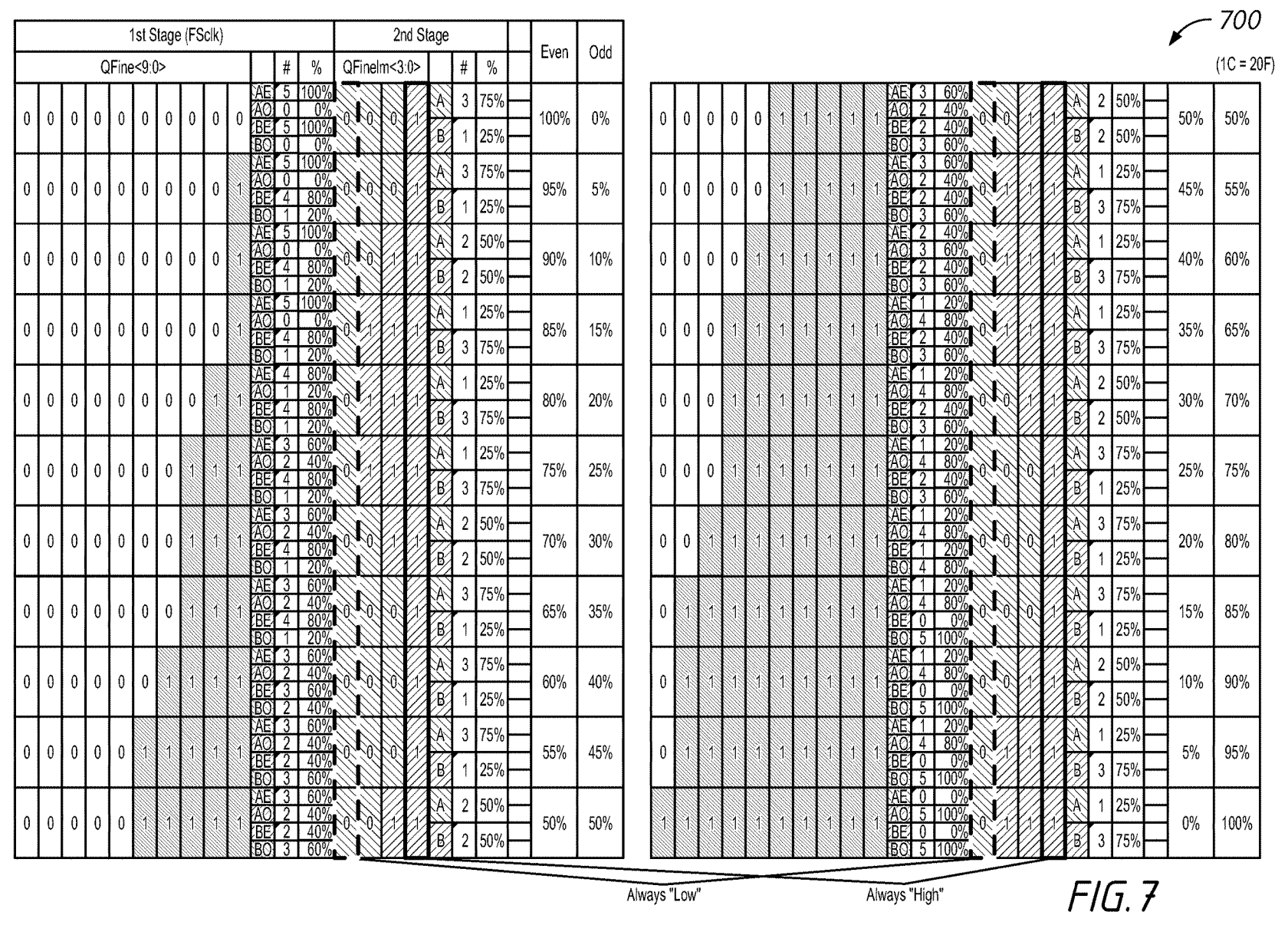
Figure 8:
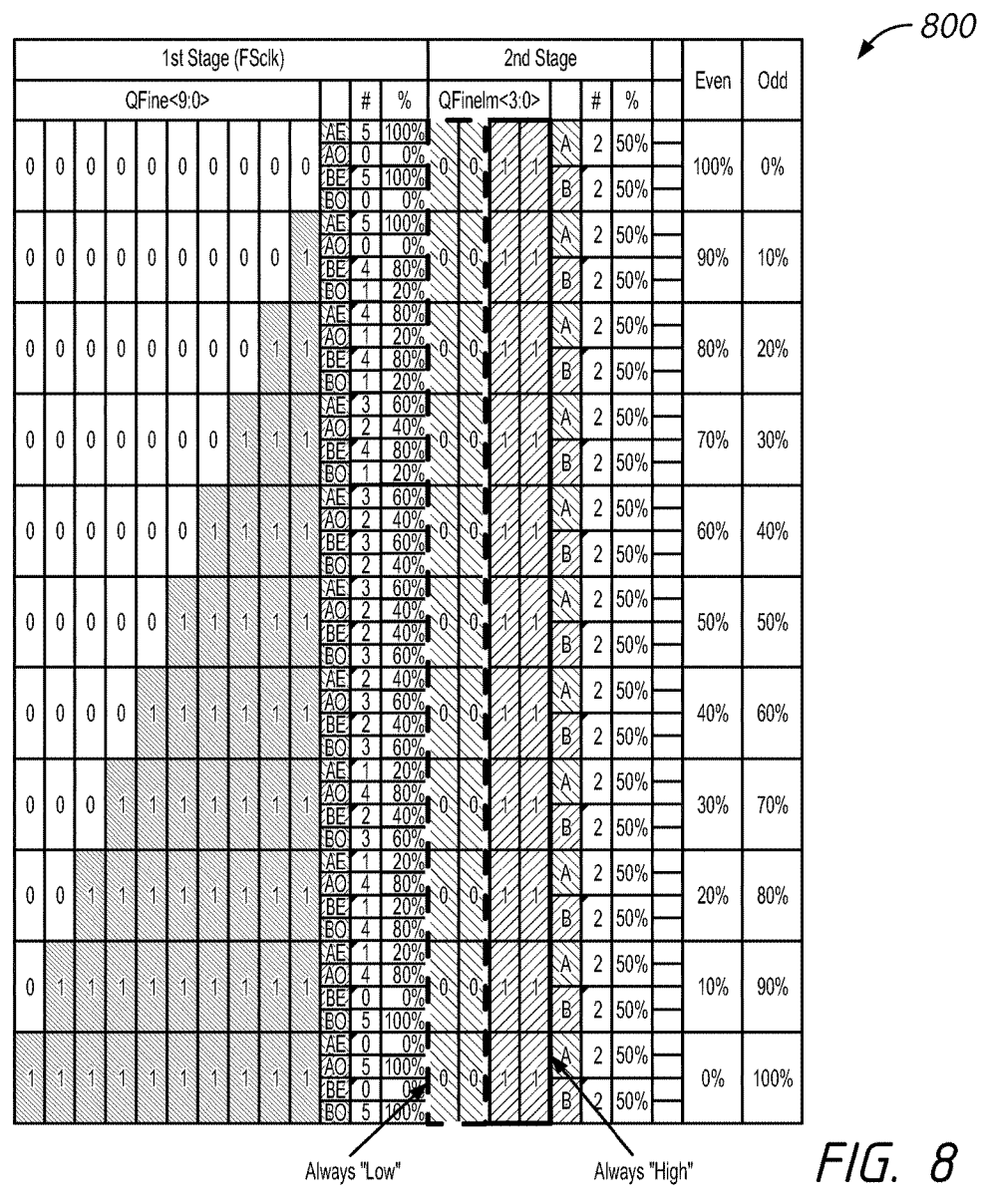
Figure 9:
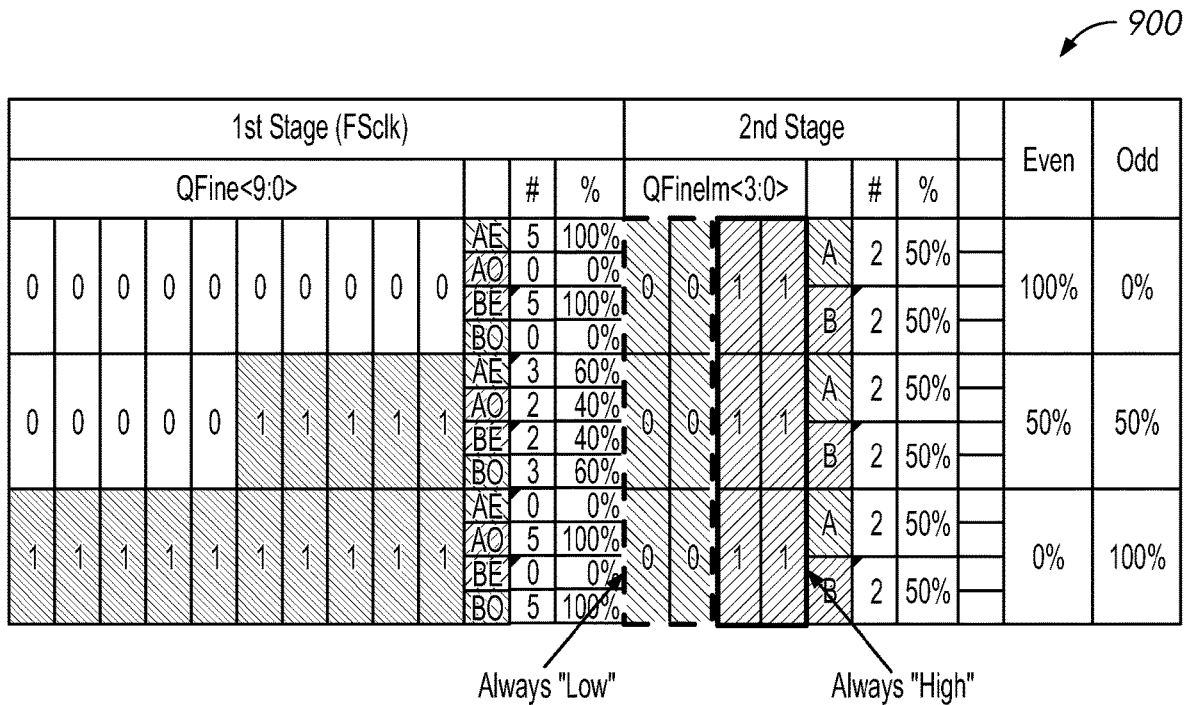
FIG. 9 is a control table showing a relationship between control signals and weights of clock signals to be mixed in accordance with an embodiment of the present disclosure.

Selection of input data (e.g., data received at the QR and QL nodes or data received at the mQR and mQL nodes) to be provided to the left and right Q nodes is controlled by a control signal EnFineShiftF. For example, the EnFineShiftF signal in an active state (e.g., logic low level), is indicative of either a high resolution mode as shown in FIG. 7, such as providing twenty steps of delay with a step size of 5%, and a middle resolution mode, such as providing ten steps of delay with a step size of 10% as shown in FIG. 8. The active EnFineShiftF signal may also control the shift registers 410(0)-410(9) to provide the data from the respective QR and QL nodes. In contrast, the EnFineShiftF signal in an inactive state (e.g., logic high level) is indicative of a low resolution mode, such as providing three steps of delay with a step size of 50% as shown in FIG. 9, and may control the shift registers 410(0)-410(9) to provide the data from the respective mQR and mQL nodes.

A reset signal RstF may also be provided after an inverter as Rst to the shift registers 410(0)-410(9). The Rst signal in an active state (e.g., logic high level) may control the shift registers 410(0)-410(9) to reset to a predetermined data value based on input data value to the respective shift register 410(0)-410(9).

QR and mQR nodes of the shift register 410(0) may be coupled to a logic high level power supply. While the EnFineShiftF signal is in the active state, the shift registers 410(1) and 410(2) may also receive at its mQR node the logic high level power supply. The shift register 410(1) may receive at its QR node the output from the left Q node of the shift register 410(0); the shift register 410(2) may receive at its QR node the output from the left Q node of the shift register 410(1). The shift register 410(3) may receive at its QR node the output from the left Q node of the shift register 410(2); and the shift register 410(4) may receive at its QR node the output from the left Q node of the shift register 410(3). The shift register 410(5) may receive at its QR node the output from the left Q node of the shift register 410(4); the shift register 410(6) may receive at its QR node the output from the left Q node of the shift register 410(5); The shift register 410(7) may receive at its QR node the output from the left Q node of the shift register 410(6); the shift register 410(8) may receive at its QR node the output from the left Q node of the shift register 410(7) and the shift register 410(9) may receive at its QR node the output from the left Q node of the shift register 410(8). These data transmissions of the shift registers 410(0)-410(9) by providing data stored to left Q nodes responsive to the shift clock signal FSclk (or FSclkF) may cause a bit shift from a right side (e.g., a side of the register 410(0)) to a left side (e.g., a side of the register 410(9)) while the fine shift left direction signal FSRD is in the inactive state. Here, registers 410(9)-410(0) may be initialized or reset to store an initial value (e.g., "0") and since the register 410(0) may receive the logic high level power supply once the initialization or reset operation is executed, the logic high level data "1" may be propagated one register by one register responsive to the shift clock signal, and one register among the register 410(0) may receive the logic high level data "1" while storing the initial value representing the logic low level "0."

The left Q node of the shift register 410(4) may also provide its output through the buffer 414 to mQR nodes of a group of the shift registers 410(5)-410(9) responsive to the inactive EnFineShiftF signal. The output of the right Q node of the shift register 410(5) may also be provided to the mQL nodes of the group of the shift registers 410(0)-410(4) through a buffer 413 responsive to the inactive EnFineShiftF signal. Thus, responsive to the inactive EnFineShiftF signal, the group of the shift registers 410(0)-410(4) may store the same data and the group of the registers 410(5)-410(9) may store the same data.

Additionally, the shift register 410(0) may receive at its QL node the output from the right Q node of the shift register 410(1); the shift register 410(1) may receive at its QL node the output from the right Q node of the shift register 410(2). The shift register 410(2) may receive at its QL node the output from the right Q node of the shift register 410(3); and the shift register 410(3) may receive at its QL node the output from the right Q node of the shift register 410(4). The shift register 410(4) may receive at its QL node the output from the right Q node of the shift register 410(5).

QL node of the shift register 410(9) may receive a logic low level power supply. The shift registers 410(9)-410(5) may also receive at its mQL node the logic low level power supply. The shift register 410(8) may receive at its QL node the output from the right Q node of the shift register 410(9); the shift register 410(7) may receive at its QL node the output from the right Q node of the shift register 410(8). The shift register 410(6) may receive at its QL node the output from the right Q node of the shift register 410(7); and the shift register 410(5) may receive at its QL node the output from the right Q node of the shift register 410(6).

In some embodiments, the buffers 413-414 shown in FIG. 4A may include series coupled inverter circuits. However, buffers including alternative or additional circuits may be used as well in other embodiments of the disclosure.

Each of the shift registers 410(0)-410(9) may further provide an output from its respective right Q node to a respective register 420(0)-420(9) in the shift register circuit 400. The outputs from the right Q nodes are stored by the respective registers 420(0)-420(9), which may provide respective control signals QFine<0:9>. In some embodiments of the disclosure, the control signals QFine<0:9> may be provided, for example, to the first stage 310 of the phase mixer 300 to control weighting of input clock signals (e.g., 0 and E).

The registers 420(1), 420(3), 420(5), 420(7) and 420(9) may further provide the respective control signals' complementary signals, QFineF<1, 3, 5, 7, 9>. The shift register circuit 400 may further include a plurality of logic circuits 430(0)-430(4). Each logic circuit of the plurality of logic circuits 430(0)-430(4) may receive control signals from adjacent registers of the registers 420(0)-420(9) and may provide outputs of logical operations as intermediate fine control signals. For example, the plurality of logic circuits 430(0)-430(4) may be NAND circuits. The logic circuit 430(0) may receive QFine<0> and QFineF<1> and provide an intermediate fine control signal QFine10. The logic circuit 430(1) may receive QFine<2> and QFineF<3> and may further provide an intermediate fine control signal QFine32. The logic circuit 430(2) may receive QFine<4> and QFineF<5> and may further provide an intermediate fine control signal QFine54. The logic circuit 430(3) may receive QFine<6> and QFineF<7> and may further provide an intermediate fine control signal QFine76. The logic circuit 430(4) may receive QFine<8> and QFineF<9> and may further provide an intermediate fine control signal QFine98.

The shift register circuit 400 may be controlled to shift data to more than one register at a time to the left (e.g., toward shift register 410(9)) or to the right (e.g., toward shift register 410(0)). The data values are changed by a group of shift registers. The shift register circuit 400 may also be controlled to shift data one register at a time to the left or to the right. The data values are changed by individual shift registers. The shift register circuit 400 may have the shift registers 410(0)-410(9) divided into four groups of shift registers to provide shifting of data to the left or right for two or four different groups of shift registers. In case of two groups, the two groups of shift registers may be (1) the shift registers 410(0)-410(4); and (2) the shift registers 410(5)-410(9). In case of four groups, the four groups of shift registers of the shift register circuit 400 may be: (1) shift registers 410(0) and 410(1); (2) shift registers 410(2)-410(4); (3) shift registers 410(5)-410(7); and (4) shift registers 410(8) and 410(9). Control of the shift operation for one register or multiple registers at a time is provided by the EnFineShiftF signal, while the fine hold signal QFineHold is in an inactive state (e.g., a logic low level "0"). On the other hand, while the fine hold signal QFineHold is in an active state (e.g., a logic high level "1"), the shift registers 410(0)-410(9) may hold the status without shifting responsive to the active QFineHold signal.

Figure 4B:
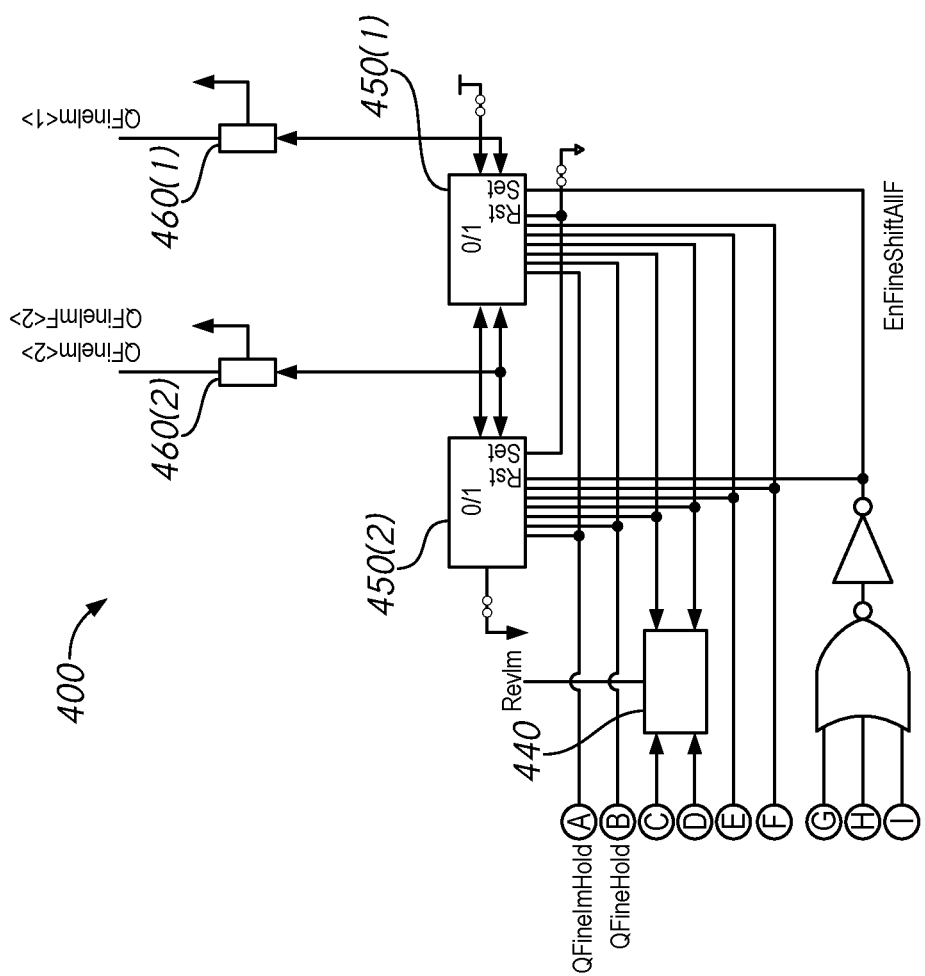
FIG. 4B is a circuit diagram of another portion of the shift register circuit in the DLL circuit in accordance with an embodiment of the present disclosure.
Figure 4C:
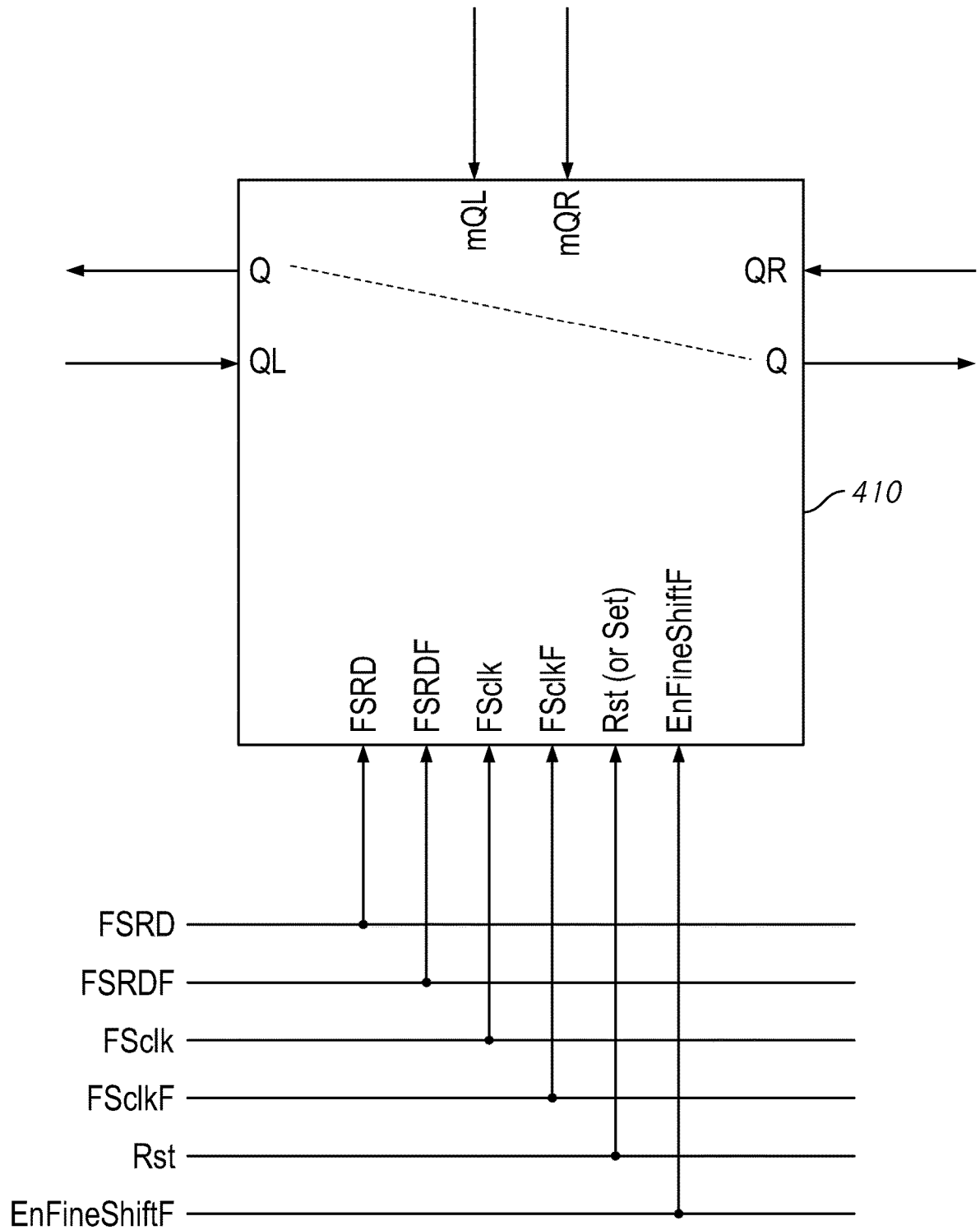
FIG. 4C is a layout diagram of a shift register in the shift register circuit in accordance with an embodiment of the present disclosure.

FIG. 4B is a circuit diagram of another portion of the shift register circuit 400 in the DLL circuit 200 in accordance with an embodiment of the present disclosure. The shift register circuit 400 may further include a shift direction selector 440. For example, the shift direction selector 440 may be a multiplexer which will be described with reference to FIG. 6. The shift direction selector 440 may receive the fine shift right direction signal FSRD, its complementary signal FSRDF and a reverse signal RevIm. The reverse signal RevIm may be provided from a control signal generator circuit, which will be described with reference to FIG. 5. The shift direction selector 440 may provide either the fine shift right direction signal FSRD or its complementary signal FSRDF as an intermediate fine shift right direction signal FSRIm or an intermediate fine shift right direction signal FSRImF responsive to the RevIm signal.

The shift register circuit 400 may further include a plurality of shift registers 450(1)-450(2). The shift registers 450(1)-450(2) may be coupled in series, and receive various control signals and clock signals. The node assignments of the shift register 410 are shown in FIG. 4C. The shift registers 450(1)-450(2) may receive control signals, such as the intermediate fine shift right direction signal FSRIm and its complementary signal FSRImF that together control a shift direction for the shift registers 450(1)-450(2), similarly to the shift registers 410(0)-(9). The FSRIm and FSRImF signals may control from which node of the shift register data is received. For example, the FSRIm signal in an active state (e.g., logic high level) and the FSRImF signal in an inactive state (e.g., logic low level) may control the shift registers 450(1)-450(2) to receive data provided to input nodes QL of the shift registers 450(1)-450(2) and provide the data value to the output nodes Q (e.g., left/right Q nodes) responsive to shift clock signals FSclk and FSclkF. The FSRIm signal in the inactive state (e.g., logic low level) and the FSRImF signal in the active state (e.g., logic high level) may control the shift registers 450(1)-450(2) to receive data provided to input nodes QR of the shift registers 450(1)-450(2) and provide the data to the output nodes Q (e.g., the left/right Q nodes) responsive to the FSclk and FSclkF clock signals. The FSclk and FSclkF clock signals are complementary. The shift registers 450(1)-450(2) may further receive control signals indicative of timings to hold the status of registers. For example, the control signals may include a fine intermediate hold signal QFineImHold that controls a timing for the shift registers 450(1)-450(2). While the fine intermediate hold signal QFineImHold is in an active state (e.g., a logic high level "1"), the shift registers 450(1)-450(2) may hold the status without shifting responsive to the active QFineImHold signal, regardless of the FSclk and FSclkF clock signals.

Selection of input data (e.g., data received at the QR and QL nodes) to be provided to the left and right Q nodes may be controlled by a control signal EnFineShiftAllF that is a result of a logic OR operation of active-low control signals EnFineShiftF, EnFineShift20F, and Rst. The control signal EnFineShift20F is indicative whether the high resolution mode, such as a mode having twenty steps of delay level with a step size of 5%, is selected. The shift register 450(1) may receive at its QR node the logic high level power supply; the shift register 450(2) may receive at its QL node the logic low level power supply. If the high resolution mode is not selected thus EnFineShift20F is inactive, the shift registers 450(2) and 450(1) may be set to predetermined data values "1" and "0" responsive to an inactive state (e.g., at a logic high level) of the EnFineShiftAllF, and the data values may be provided through the buffers 460(1) and 460(0). If the high resolution mode is selected thus EnFineShift20F is active, either the shift register 450(1) may provide data "1" from the QR node to the buffer 460(1), or when shift occurs responsive to the FSRImF signal, the shift register 450(1) may further provide data "1" in the shift register 450(1) to the buffer 460(2). Thus, the outputs from the shift registers 450(1)-450(2) are driven by the respective buffers 460(1)-460(2), which may provide respective control signals QFineIm<2:1>. As stated above, QFineIm<2:1> signals may be fixed to "01" when the shift registers 450(2) and 450(1) are reset, or when the high resolution mode is not selected. On the other hand, QFineIm<2:1> signals may shift from "00," to "01" and "11" or may shift from "11", to "01" and "00" when the high resolution mode is selected. The shift direction is responsive to the RevIm signal. In some embodiments of the disclosure, even not shown, the control signals QFineIm<3> and <0> may be fixed to "0" and "1." Thus, the control signals QFineIm<2:1> may be provided, for example, to the second stage 320 of the phase mixer 300 to control weighting of the intermediate clock signals (e.g., intA and intB). Thus, control of the shift operation for one or two registers of registers 450(2) and 450(1) may be determined by the EnFineShiftF signal, the EnFineShift20F signal and the RevIm signal.

FIG. 4C is a layout diagram of shift register 410 and shift register 450 in the shift register circuit 400 in accordance with an embodiment of the present disclosure. For example, the shift register 410 may be a logic integrated circuit including a plurality of logic gates. In operation, the shift register may be controlled by the EnFineShiftF signal to provide an output selected from either the data provided to the QL and QR nodes or the data provided to the mQL and mQR nodes, and further, the shift register 410 may be controlled by the FSRD and FSRDF signals to provide the data provided to one of the left input nodes or the data provided to one of the right input nodes. By using the EnFineShiftF signal and the FSRD and FSRDF signals, data provided to one of the inputs QL, QR, mQL, or mQR, is provided for latching and shifting. The Rst signal may indicate "data set" while its logic state is "1" and may further indicate "data reset (to store preset values)" while its logic state is "0." While the Rst signal is active, the shift register 410 may load the data (QL or QR) while the FSclk signal is being in a logic low state, and may provide the loaded data at its Q node on a next rising clock edge of the FSclk signal. While the Rst signal is inactive, the shift register 410 may be configured to reset to the preset values, either "0" or "1" at the node Q. Since the Rst signal is commonly provided to all the shift registers 410 and 450, all the shift registers may be reset responsive to the inactive Rst signal simultaneously.

Operation of the shift register circuit 400 according to an embodiment of the disclosure will be described with reference to tables included in FIGS. 7A, 8 and 9. As previously described, the shift register circuit 400 may be controlled to shift data to more than one register at a time to the left or to the right. The data values are changed by a group of shift registers. The EnFineShiftF signal is a logic high level to control the shift register circuit 400 to operate in this manner Together with tables in FIGS. 7A, 8 and 9, operation will be described in this manner for the shift register circuit 400 according to various embodiments of the disclosure.

Figure 5:
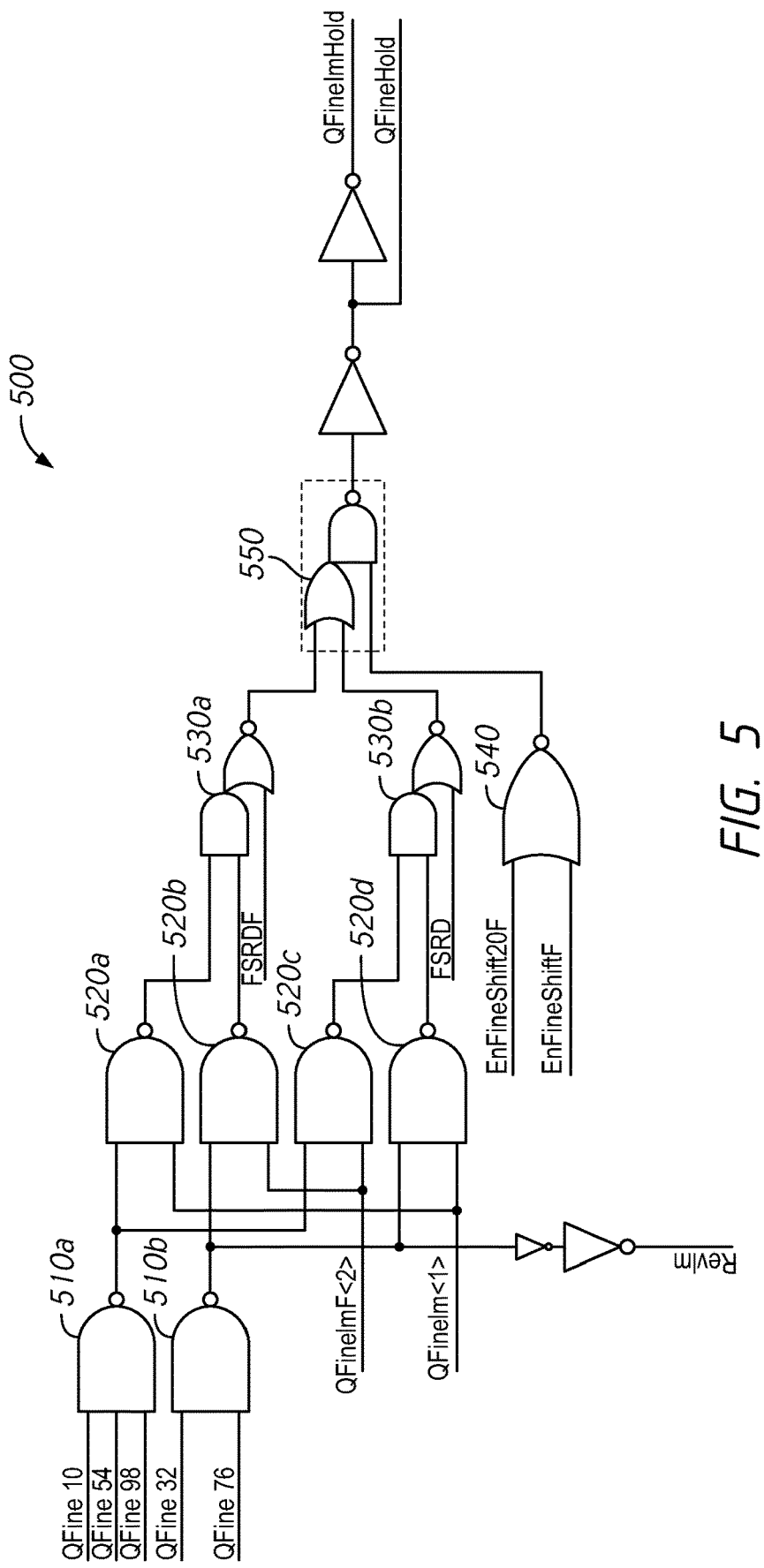
FIG. 5 is a circuit diagram of a control signal generator circuit in the DLL circuit in accordance with an embodiment of the present disclosure.

The shift register circuit 400 may further include a control signal generator circuit. FIG. 5 is a circuit diagram of a control signal generator circuit 500 in the shift register circuit 400 in accordance with an embodiment of the present disclosure. The control signal generator circuit 500 may provide the reverse signal RevIm, the fine hold signal QFineHold and the fine intermediate hold signal QFineImHold. Note a structure of the control signal generator circuit may not be limited to this control signal generator circuit 500. Instead, any logic circuit which may provide the reverse signal RevIm, the fine hold signal QFineHold and the fine intermediate hold signal QFineImHold may properly serve as the control signal generator circuit. The control signal generator circuit 500 may include NAND circuits 510a, 510b and 520a to 520d. The NAND circuit 510a may receive the intermediate fine control signals QFine10, QFine54, and QFine98. When either the QFine10 signal, the QFine54 signal or the QFine76 signal is "0" (i.e., either QFine<1:0>, QFine<5:4> or QFine<9:8> become <0:1>), the output signal of the NAND circuit 510a becomes active. The NAND circuit 510b may receive the intermediate fine control signals QFine32 and QFine76. When either the QFine32 signal or the QFine76 signal is "0" (i.e., either QFine<3:2> or QFine<7:6> become <0:1>), the output signal of the NAND circuit 510b becomes active. The output signal of the NAND circuit 510b is the RevIm signal that enables the shift direction in a reverse direction between the shift registers 450(2) and 450(1).

The NAND circuits 520a and 520c may receive an output signal of the NAND circuit 510a and the NAND circuits 520b and 520d may receive an output signal of the NAND circuit 510b that is the reverse signal RevIm. The NAND circuit 520a and 520c may further receive the QFineImF<2> signal that is a complementary signal of QFineIm<2>, and the NAND circuit 520b and 520d may further receive the QFineIm<1> signal. The control signal generator circuit 500 may further include logic circuits 530a and 530b. The logic circuit 530a may receive output signals of the NAND circuits 520a and 520b, execute a logic AND operation of the output signals of the NAND circuits 520a and 520b, and further execute a logic NOR operation of a result signal of the logic AND operation and the FSRDF signal. Similarly, the logic circuit 530b may receive output signals of the NAND circuits 520c and 520d, execute a logic AND operation of the output signals of the NAND circuits 520c and 520d, and further execute a logic NOR operation of a result signal of the logic AND operation and the FSRD signal. The control signal generator circuit 500 may further include a logic circuit 540. The logic circuit 540 may be a logic NOR circuit. The logic circuit 540 may execute a logic NOR operation of the EnFineShift20F and EnFineShiftF signals. For example, when unless the low resolution mode is selected, the logic circuit 540 may provide an active signal to another logic circuit 550 to constantly provide the active QFineImHold signal to constantly hold the shift registers 450(0) and 450(1) to maintain the 4 bit phase mixing code represented by QFineIm<3-0> and also constantly provide the inactive QFineHold signal to operate the shift registers 410(9)-410(0) in a manner that shift occurs responsive to the value to update the 10 bit phase mixing code represented by QFine<9-0>. The logic circuit 550 may further receive output signals of the logic circuits 530a and 530b and execute a logic OR operation to obtain whether next shift occurs in among the shift registers 410(9)-410(0) or 450(1)-450(0).

In the high resolution mode, when either one of the QFine10 signal, QFine54 signal, QFine98 signal, QFine32 signal or QFine76 signal becomes "0," while the QFineImHold is active, the QFineImHold becomes inactive and the shift registers 450(1)-450(0) starts operating their shift functions until QFineImF<2> and QFineIm<1> become different to update the 4 bit phase mixing code represented by QFineIm<3-0>. Once they become different (i.e., QFineImF<2:1> becomes "11" or "00"), the QfineImHold becomes active and QfineHold becomes inactive again, thus the shift registers 450(1)-450(0) stops operating their shift functions which results in maintaining the 4 bit mixing code while the shift registers 410(9)-410(0) start their shift functions to update the 10 bit phase mixing code represented by QFine<9-0> until either one of the QFine10 signal, QFine54 signal, QFine98 signal, QFine32 signal or QFine76 signal becomes "0" again.

Figure 6:
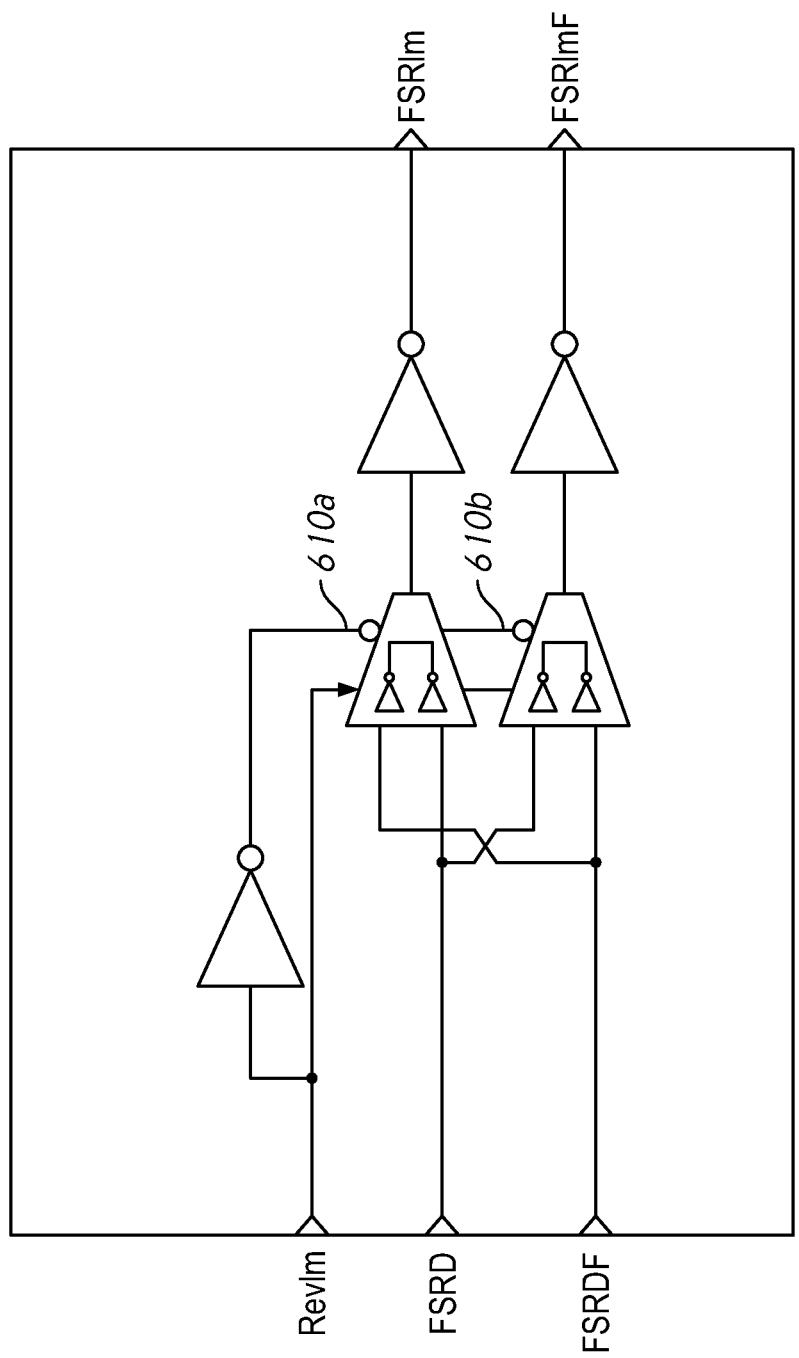
FIG. 6 is a circuit diagram of a shift direction selector in the DLL circuit in accordance with an embodiment of the present disclosure.

FIG. 6 is a circuit diagram of a shift direction selector 600 in the DLL circuit 200 in accordance with an embodiment of the present disclosure. For example, the shift direction selector 600 may be the shift direction selector 440. The shift direction selector 600 may include a plurality of multiplexers 610a and 610b. Each of the plurality of multiplexer 610a and 610b may receive the fine shift right direction signals FSRD and FSRDF and the reverse signal RevIm and its inverted signal through an inverter in the shift direction selector. The multiplexer 610a may provide the inverted signal of the FSRD signal as an output signal responsive to an active state of the inverted signals of the RevIm signal and may further provide the inverted signal of the FSRDF signal as an output signal responsive to an active state of the RevIm signal. The output signal of the multiplexer 610a may be inverted by another inverter which may provide an intermediate fine shift right direction signal FSRIm as the inverted signals of the output signal of the multiplexer 610a. The multiplexer 610b may provide the inverted signal of the FSRDF signal as an output signal responsive to an active state of the inverted signal of the RevIm signal and may further provide the inverted signal of the FSRD signal as an output signal responsive to an active state of the RevIm signal. The output signal of the multiplexer 610b may be inverted by another inverter which may provide an intermediate fine shift right direction signal FSRImF as the inverted signals of the output signal of the multiplexer 610b. Thus, shift direction selector 600 may provide either the fine shift right direction signal FSRD or its complementary signal FSRDF as the intermediate fine shift right direction signal FSRIm or the intermediate fine shift right direction signal FSRImF responsive to the RevIm signal.

FIG. 7 is a control table 700 showing a relationship between control signals and weights of clock signals to be mixed in accordance with an embodiment of the present disclosure. The table 700 shows bit structures of QFine<9:0> signals provided to the first stage (e.g., the first stage 310 in FIG. 3) and QFineIm<3:0> signals provided to the second stage (e.g., the second stage 320 in FIG. 3). Note the QFineIm<3> signal may take a constant value (e.g., a logic low level "0") and QFineIm<0> signal may take a constant value (e.g., a logic high level "1"). When either QFine<1:0> signals, QFine<5:4> signals, QFine<9:8> signals, QFine<3:2> signals or QFine<7:6> signals become "01," QFine<9:0> signals stop bit shifting and QFineIm<2:1> signals start bit shifting. As previously discussed, QFineIm<2:1> signals shift from "00"→"01"→"11" when either QFine<1:0>, QFine<5:4>, or QFine<9:8> becomes "01" and QFineIm<2:1> signals shift from "11"→"01"→"00" when either QFine<3:2> or QFine<7:6> becomes "01." When the shifting in one direction is complete in the QFineIm<2:1> signals, the QFine<9:0> signals starts bit shifting until either QFine<1:0> signals, QFine<5:4> signals, QFine<9:8> signals, QFine<3:2> signals or QFine<7:6> signals become "01" again. While the QFineIm signals are not bit shifting, QFine<9:0> signals may change by bit shifting from "0000000000" to "1111111111" by shifting "1" to a higher (left) bit one by one without changing lower bit's "1." As described earlier with referring to FIGS. 4A-4C, 5 and 6, the shift register circuit 500 may provide QFine and QFineIm signals to control the phase mixer 300 in FIG. 3.

The first stage 310 of the phase mixer 300 may provide intermediate clock signals intA and intB that are mixture of the input clock signals E and O with weights responsive to the QFine<9:0> signals.

For example, when QFine<9:0> signals are "000000001," the sub mixers 311a to 311e may provide the even input clock signals E as the intA signal responsive to the QFine<1, 2, 5, 6, 9> signals being "0" respectively. At the same time, one sub mixer (e.g., the sub mixer 312a) may provide the odd input clock signal O responsive to the QFine<0> signal being "1" as a portion of the intB signal on Path B, whereas and four sub mixers 312b to 312e may provide the even input clock signals E as a portion of the intB signal on Path B, responsive to the QFine<3, 4, 7, 8> signals being "0" respectively. Thus, the intA signal has a phase with a 100% weight of the even input clock signal E on Path A (AE: 100%; AO: 0%) on Path A, and the intB signal has a phase with a 80% weight of the even input clock signal E on Path B (BE: ⅘=80%) and a 20% weight of the odd input clock signal O on Path B (BO: ⅕=20%). As shown in the table, the intermediate clock signals intA and intB may have 11 steps based on 11 patterns of the QFine<9:0> signals.

The second stage 320 of the phase mixer 300 may provide the internal clock signal LCLK that are mixture of the intermediate clock signals intA and intB. Because the sub mixer 322c may receive the power supply that is constant, the sub mixer 322c may effectively function as receiving QFineIm<3, 0> signals which can be represented as "0, 1" and provide 25% weights of the intermediate clock signals intA and intB. For example, when QFineIm<2:1> signals are "00," QFineIm<3:0> signals may be represented as "0001." The sub mixers 322a and 322b may provide a 25% weight of the intermediate clock signal intA respectively, whereas the sub mixer 322c may provide 25% weights the intermediate clock signals intA and intB. Thus, the second stage 320 may provide with a 75% (¾) weight of the intermediate clock signal intA, and a 25% (=¼) weight of the intermediate clock signal intB. When QFine<9:0> signals are indicative of "0000000001," and QFineIm<3:0> signals are indicative as <0001>, a 100% weight of the even input clock signal E on Path A and a 80% weight of the even input clock signal E on Path B and a 20% weight of the odd input clock signal O on Path B are mixed. Thus, the weight of the even input signal E is 95% (=100%*75%+80%*25%) and the weight of the odd input clock signal O is 5% (=20%*25%). Similarly, by providing combining eleven patterns of QFine signals to the first stage 310 and three patterns of QFineIm signals to the second stage 320 where a bit shifting occurs one at a time either in QFine or QFineIm signals, the high resolution mode of twenty steps of delay with a step size of 5% may be provided.

In another example, when QFine<9:0> signals are "0000000011," the sub mixer 311a may provide the odd input clock signals O responsive to the QFine<1> signal being "1" as a portion of the intA signal on Path A, whereas four sub mixers 311b to 311e may provide the even input clock signals E as a portion of the intA signal responsive to the QFine<2, 5, 6, 9> signals being "0" respectively. At the same time, one sub mixer (e.g., the sub mixer 312a) may provide the odd input clock signal O responsive to the QFine<0> signal being "1" as a portion of the intB signal on Path B, whereas and four sub mixers 312b to 312e may provide the even input clock signals E as a portion of the intB signal on Path B, responsive to the QFine<3, 4, 7, 8> signals being "0" respectively. Thus, the intA signal has a phase with a 80% weight of the even input clock signal E on Path A (AE: ⅘=80%) and a 20% weight of the odd input clock signal O on Path A (AO: ⅕=20%), and the intB signal has a phase with a 80% weight of the even input clock signal E on Path B (BE: ⅘=80%) and a 20% weight of the odd input clock signal O on Path B (BO: ⅕=20%). In this example, because the weight relationships between the even input clock signal E and the odd input clocks signal O are the same between Path A and Path B, thus, regardless of the QFineIm signals, the phase keeps the relationship of 80% of the even input clock signal E and 20% of the odd input clocks signal O without shifting the QFineIm signals to "1111", thus QFineIm<3> may take a fixed "0" value.

As shown above, the combination of two bit shifting stages may provide a plurality of stages of delay with a higher resolution, such as twenty steps of delay with a step size of 5% with 12 bits while inverting one bit at a time. Limiting the bit inversion to a small number of bits, such as one bit, may reduce noise in operation while shifting the phase, compared to larger inversions, such as shifting from "01111111" to "10000000").

FIG. 8 is a control table 800 showing a relationship between control signals and weights of clock signals to be mixed in accordance with an embodiment of the present disclosure. The table 800 shows bit structures of QFine<9:0> signals provided to the first stage (e.g., the first stage 310 in FIG. 3) and QFineIm<3:0> signals provided to the second stage (e.g., the second stage 320 in FIG. 3). Here, the EnFineShift20F signal is in an inactive state and thus the QFineHold signal is inactive and the QFineImHold signal is active. Thus, the QFineIm<3:0> signals may take constant values (e.g., "0011"). Since the EnFineShiftF signal is in an active state, QFine<9:0> signals may change by bit shifting from "0000000000" to "1111111111" by shifting "1" to a higher (left) bit one by one without changing lower bit's "1." As described earlier with referring to FIGS. 4A-4C, 5 and 6, the shift register circuit 500 may provide QFine signals and the constant QFineIm signals to control the phase mixer 300 in FIG. 3.

The first stage 310 of the phase mixer 300 may provide intermediate clock signals intA and intB that are mixture of the input clock signals E and O with weights responsive to the QFine<9:0> signals, as earlier described with referring to the first stage 310 of FIG. 3 in context of the control table 700 of FIG. 7, thus not repeated. The intermediate clock signals intA and intB may have a combination of phases with weights having steps of 10%, a total of 100%. The second stage 320 of the phase mixer 300 may provide the internal clock signal LCLK that are mixture of 50% weights of the intermediate clock signals intA and intB both, because of the constant values (e.g., "0011") of the QFineIm<3:0> signals. When QFine<9:0> signals are indicative of "0000000001," and QFineIm<3:0> signals are indicative as <0011>, a 100% weight of the even input clock signal E on Path A, a 80% weight of the even input clock signal E on Path B and a 20% weight of the odd input clock signal O on Path B are mixed. Thus, the weight of the even input signal E is 90% (=100%*50%+80%*50%) and the weight of the odd input clock signal O is 10% (=20%*50%). Similarly, by providing combining 11 patterns of QFine signals to the first stage 310 and the fixed pattern of QFineIm signals to the second stage 320 where a bit shifting occurs one at a time either in QFine signals, the middle resolution mode of 10 steps of delay with a step size of 10% may be provided. This combination of actively using the first bit shifting stage may provide a plurality of stages of delay with a middle resolution, such as 10 steps of delay with a step size 10% with 10 bits while inverting one bit at a time. Limiting the bit inversion to a small number of bits, such as one bit, may reduce noise in operation while shifting the phase, compared to larger inversions, such as shifting from "01111111" to "10000000").

FIG. 9 is a control table 900 showing a relationship between control signals and weights of clock signals to be mixed in accordance with an embodiment of the present disclosure. The table 900 shows bit structures of QFine<9:0> signals provided to the first stage (e.g., the first stage 310 in FIG. 3) and QFineIm<3:0> signals provided to the second stage (e.g., the second stage 320 in FIG. 3). Here, the EnFineShift20F signal is in the inactive state and thus the QFineHold is inactive. The QFineImHold signal is active, thus the QFineIm<3:0> signals may take constant values (e.g., "0011"). Since the EnFineShiftF signal is in inactive state, QFine<9:0> signals may change by bit shifting from "0000000000" to "0000011111" and further to "1111111111" by shifting "1" to a higher (left) bit five bits by five bits, as earlier described with regards to the shift registers 410(9)-410(0) using the mQR and mQL nodes responsive to the inactive EnFineShiftF signal. As described earlier with referring to FIGS. 4A-4C, 5 and 6, the shift register circuit 500 may provide QFine signals and the constant QFineIm signals to control the phase mixer 300 in FIG. 3.

The first stage 310 of the phase mixer 300 may provide intermediate clock signals intA and intB that are mixture of the input clock signals E and O with weights responsive to the QFine<9:0> signals. Unlike bit shifting in the high and middle resolution modes, the intermediate clock signals intA and intB may have a combination of phases with weights with steps of 50%, a total of 100%. For example, when the QFine<9:0> signals are indicative of "0000011111," the two sub mixers 311a to 311b may provide the odd input clock signal O responsive to the QFine<1, 2> signals being "1" on the intA signal and the three sub mixers 311c to 311e may provide the even input clock signals E on the intA signal responsive to the QFine<5, 6, 9> signals being "0" respectively. At the same time, three sub mixers 312a to 312c may provide the odd input clock signal O responsive to the QFine<0, 3, 4> signals being "1" as a portion of the intB signal, whereas and two sub mixers 312d to 312e may provide the even input clock signals E as another portion of the intB signal on Path B, responsive to the QFine<7, 8> signals being "0" respectively. Thus, the intA signal has a phase with a 60% weight of the even input clock signals E (AE: ⅗=60%) and a 40% weight of the odd input clock signals on Path A (AO: ⅖=40%), and the intB signal has a phase with a weight 40% of the even input clock signal E on Path B (BE: ⅖=40%) and a weight of 60% of the odd input clock signal O on Path B (BO: ⅗=60%). The intermediate clock signals intA and intB may have a combination of phases with weights with three steps, a total of 100%.

The second stage 320 of the phase mixer 300 may provide the internal clock signal LCLK that are mixture of 50% weights of the intermediate clock signals intA and intB each, because of the constant values (e.g., "0011") of the QFineIm<3:0> signals. When QFine<9:0> signals are indicative of "0000011111," and QFineIm<3:0> signals are indicative as <0011>, a 60% weight of the even input clock signal E on Path A, a 40% weight of the even input clock signal E on of Path B, a 40% weight of the odd input clock signal O on Path A and a 60% weight of the odd input clock signal O on Path B are mixed. Thus, the weight of the even input signal E is 50% (=60%*50%+40%*50%) and the weight of the odd input clock signal O is 50% (=40%*50%+60%*50%). Similarly, by providing combining three patterns of QFine signals to the first stage 310 and the fixed pattern of QFineIm signals to the second stage 320 where multi-bit shifting occurs at a time either in QFine signals, the low resolution mode of three steps of delay with a step size of 50% may be provided. Here, bit shifting may not be limited to a small number of bits.

Although various embodiments have been disclosed, it will be understood by those skilled in the art that the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

What is claimed is:

1. An apparatus, comprising:
an adjustable delay line; and
a shift register circuit configured to provide delay control signals to adjust an amount of the adjustable delay line, the shift register circuit including:
a plurality of first registers coupled in series to one another, each first register of the plurality of first registers is configured store first data having either a first value or a second value, wherein each first register of the plurality of first registers is configured to provide the first data, wherein an adjacent first register is configured to receive the first data responsive to a shift clock signal; and
a plurality of second registers coupled in series to one another, each second register of the plurality of second registers is configured to store second data either the first value or the second value,
wherein either one first register or one second register storing data having the first value is configured to receive next data having the second value responsive to the shift clock signal.

2. The apparatus of claim 1, wherein the one first register is configured to receive the next data while storing the data when the plurality of second registers are configured to hold data responsive to a first hold control signal.

3. The apparatus of claim 2, wherein each second register of the plurality of second registers are configured to store a constant value in a first mode and a second mode.

4. The apparatus of claim 3, wherein a group of first registers is configured to receive the second data while storing the first data in the first mode.

5. The apparatus of claim 3, wherein the one second register is configured to receive the next data while storing the data, when the plurality of first registers are configured to hold data responsive to a second hold control signal that is a complementary signal of the first hold control signal in a third mode.

6. The apparatus of claim 5, further comprising a control signal generator circuit,
wherein the control signal generator circuit is configured to provide a reverse signal,
wherein the adjacent first register is adjacent is a first direction,
wherein one or more second registers of the plurality of second registers are configured to provide the data to an adjacent second register in a second direction responsive to the shift clock signal and further responsive to the reverse signal in an active state, and wherein one or more second registers of the plurality of second registers are configured to provide the data to an adjacent second register in a third direction opposite to the second direction responsive to the shift clock signal and further responsive to the reverse signal in an inactive state.

7. The apparatus of claim 6, further comprising a shift direction selector configured to provide one of a shift direction signal and its complementary signal to the plurality of second registers responsive to the reverse signal.

8. A method, comprising:
providing data values stored by a plurality of first registers and a plurality of second registers, comprising:
during a first mode of operation, receiving the data values by a plurality of groups of first registers of the plurality of first registers and holding the data values by the plurality of second registers;
during a second mode of operation, inverting a data value by one first register of the plurality of first registers at a time and holding the data values by the plurality of second registers; and
during a third mode of operation, either:
inverting the data value by one first register of the plurality of first registers while holding the data values by the plurality of second registers, or
inverting a data value by one second register of the plurality of second registers while holding the data values by the plurality of first registers.

9. The method of claim 8, further comprising:
receiving a power supply by another first register of the plurality of first registers;
during the first mode, the other first register in a group of the plurality of groups is configured to provide the power supply to the rest of first registers in the group; and
during the second mode and the third mode, the other first register is configured to provide the power supply to an adjacent first register of the plurality of first registers coupled in series.

10. The method of claim 8, further comprising:
providing a reverse signal during the third mode;
providing the data to an adjacent second register in a first direction by at least one second register of the plurality of second registers responsive to a shift clock signal and further responsive to the reverse signal in an active state; and
providing the data to another adjacent second register in a second direction by at least one second register of the plurality of second registers responsive to the shift clock signal and further responsive to the reverse signal in an inactive state.

11. The method of claim 10, further comprising:
executing a logical operation of one first register and an adjacent first register of the plurality of first registers; and
providing the reverse signal responsive, at least in part, to the logical operation; and
providing a first hold signal and a second hold signal that is a complementary signal of the first hold signal, responsive, at least in part, to the logical operation; and
wherein the plurality of second registers are configured to hold the data values responsive to the second hold signal; and
wherein the plurality of first registers are configured to hold the data values responsive to the first hold signal.

12. The method of claim 10, further comprising:
providing one of a shift direction signal and its complementary signal to the plurality of second registers responsive to the reverse signal.

13. The method of claim 8, further comprising:
providing data values stored by the plurality of first registers as a first plurality of control signals;
providing data values stored by the plurality of second registers as a second plurality of control signals;
adjusting a delay of a phase mixer circuit by providing a plurality of steps of delay adjustment;
receiving a first clock signal and a second clock signal at the phase mixer circuit,
receiving the first plurality of control signals at a first stage of the phase mixer circuit;
providing a first intermediate clock signal by mixing a first weight of the first clock signal of and a second weight of the second clock signal responsive to a first portion of first plurality of control signals;
providing a second intermediate clock signal by mixing a third weight of the first clock signal and a fourth weight of the second clock signal responsive to a second portion of first plurality of control signals;
receiving the second plurality of control signals and the first and second intermediate clock signals at a second stage of the phase mixer circuit; and
providing an output clock signal by mixing a fifth weight of the first intermediate clock signal of and a sixth weight of the second intermediate clock signal, responsive to the second plurality of control signals.

\* \* \* \* \*